United States Patent
Ni et al.

(10) Patent No.: US 8,277,958 B2
(45) Date of Patent: Oct. 2, 2012

(54) ALUMINUM TITANIUM NITRIDE COATING AND METHOD OF MAKING SAME

(75) Inventors: Wangyang Ni, Latrobe, PA (US); Ronald M. Penich, Greensburg, PA (US); Yixiong Liu, Greensburg, PA (US); Michael F. Beblo, Delmont, PA (US)

(73) Assignee: Kennametal Inc., Latrobe, PA (US)

( * ) Notice: Subject to any disclaimer, the term of this patent is extended or adjusted under 35 U.S.C. 154(b) by 224 days.

(21) Appl. No.: 12/572,858

(22) Filed: Oct. 2, 2009

(65) Prior Publication Data

US 2011/0081539 A1    Apr. 7, 2011

(51) Int. Cl.
*B32B 9/00* (2006.01)

(52) U.S. Cl. .......... 428/697; 51/307; 51/309; 428/325; 428/336; 428/698; 428/699

(58) Field of Classification Search .............. None
See application file for complete search history.

(56) References Cited

U.S. PATENT DOCUMENTS

| | | | |
|---|---|---|---|
| 5,296,016 A | 3/1994 | Yoshimura et al. |
| 5,712,030 A | 1/1998 | Goto et al. |
| 6,033,734 A | 3/2000 | Muenz et al. |
| 6,071,560 A | 6/2000 | Braendle et al. |
| 6,077,596 A | 6/2000 | Hashimoto et al. |
| 6,110,571 A | 8/2000 | Yaginuma et al. |
| 6,250,855 B1 | 6/2001 | Persson et al. |
| 6,274,249 B1 | 8/2001 | Braendle et al. |
| 6,333,099 B1 | 12/2001 | Strondl et al. |
| 6,395,379 B1 | 5/2002 | Braendle |
| 6,558,749 B2 | 5/2003 | Braendle |
| 6,565,957 B2 | 5/2003 | Nakamura et al. |
| 6,599,062 B1 | 7/2003 | Oles et al. |
| 6,669,747 B2 | 12/2003 | Salmon |
| 6,688,817 B2 | 2/2004 | Borschert et al. |
| 6,737,178 B2 | 5/2004 | Ota et al. |
| 6,811,581 B2 | 11/2004 | Yamada et al. |
| 6,838,151 B2 | 1/2005 | Kato |
| 6,844,069 B2 | 1/2005 | Braendle et al. |
| 6,866,921 B2 | 3/2005 | Grab et al. |
| 6,924,454 B2 | 8/2005 | Massa et al. |
| 7,018,726 B2 | 3/2006 | Usami et al. |
| 7,094,479 B2 | 8/2006 | Sato et al. |
| 7,169,485 B2 | 1/2007 | Kohara et al. |
| 7,188,463 B2 | 3/2007 | Schuller et al. |

(Continued)

FOREIGN PATENT DOCUMENTS

EP    0 492 059 B1    7/2000

(Continued)

OTHER PUBLICATIONS

Rauch, J.Y., et al., "Structure and Compositions of TixAl1-xN Thin Films Sputter Deposited Using a Composite Metallic Target," Surface and Coatings Technology 157 (2002) pp. 138-143.

(Continued)

*Primary Examiner* — Archene Turner
(74) *Attorney, Agent, or Firm* — Matthew W. Gordon, Esq.

(57) ABSTRACT

Hard coatings and methods of making the hard coatings comprising aluminum titanium nitride which are usable on cutting tools are disclosed. The coatings include at least one aluminum titanium nitride layer having between about 0 and about 15 weight percent hexagonal phase and a composition of $(Al_xTi_{1-x})N$, where x is in the range of about 0.53 to about 0.58 moles.

10 Claims, 2 Drawing Sheets

U.S. PATENT DOCUMENTS

| | | | |
|---|---|---|---|
| 7,431,988 B2 | 10/2008 | Hanyu et al. | |
| 7,767,319 B2 * | 8/2010 | Åkesson et al. | 428/697 |
| 8,025,956 B2 * | 9/2011 | Yamamoto et al. | 428/336 |
| 2006/0154051 A1 | 7/2006 | Ahlgren | |
| 2006/0219325 A1 | 10/2006 | Kohara | |
| 2006/0257562 A1 | 11/2006 | Tamagaki et al. | |
| 2007/0059558 A1 | 3/2007 | Schier | |
| 2007/0148496 A1 | 6/2007 | Takaoka et al. | |
| 2007/0292671 A1 | 12/2007 | Akesson et al. | |
| 2008/0286608 A1 | 11/2008 | Quinto et al. | |
| 2008/0299383 A1 | 12/2008 | Martensson et al. | |
| 2009/0075114 A1 | 3/2009 | Hovsepian et al. | |
| 2009/0098372 A1 | 4/2009 | Ishii et al. | |

FOREIGN PATENT DOCUMENTS

| | | |
|---|---|---|
| EP | 0 558 061 B1 | 8/2000 |
| EP | 0 801 144 B1 | 5/2001 |
| EP | 0 709 353 B1 | 6/2002 |
| EP | 0 885 984 B1 | 7/2002 |
| EP | 1 017 870 B1 | 10/2002 |
| EP | 1 021 584 B1 | 11/2003 |
| EP | 1 087 026 B1 | 11/2003 |
| EP | 1 038 989 B1 | 6/2004 |
| EP | 1 122 226 B1 | 3/2006 |
| EP | 1 683 875 A2 | 7/2006 |
| EP | 1 099 003 B1 | 9/2006 |
| EP | 1 674 597 B1 | 1/2008 |
| JP | 08-209333 * | 8/1996 |
| WO | WO 2005/111257 A2 | 11/2005 |
| WO | WO 2008/037556 A2 | 4/2008 |
| WO | WO 2009/031958 A1 | 3/2009 |

OTHER PUBLICATIONS

Ahlgren, M., et al., "Influence of Bias Variation on Residual Stress and Texture in TiAlN PVD Coatings," Surface & Coatings Technology 200 (2005) pp. 157-160.

ISA/KR, PCT Written Opinion and International Search Report for PCT/US2010/047457 (mailed May 2, 2011).

Paldey et al., "Single layer and Multilayer Wear Resistant Coatings of (Ti, Al)N: A Review," Mat. Sci. Engineer., A342 (2003) 58-79.

Musil et al., "Superhard Nanocomposite Ti1-xAlxN Films Prepared by Magnetron Sputtering," Thin Solid Films 365 (2000) 104-109.

Horling et al., "Mechanical Properties and Machining Performance of Ti1-xAlxN-Coated Cutting Tools," Surface & Coating Tech. 191 (2005) 384-392.

Hakansson et al., "Microstructure and Phys. Prop. of Polycrystalline Metastable Ti0.5Al0.5N alloys Grown by D.C. Magnetron Sputter Dep.," Thin Solid Films 191 (1987) 55-65.

Huang et al., "Dep. of (Ti,Al)N films on A2 Tool Steel by Reactive R.F. Magnetron Sputtering," Surface and Coatings Tech. 71 (1995) 259-266.

Arndt et al., "Performance of New AlTiN Coatings in Dry and High Speed Cutting," Surface and Coatings Tech. 163-164 (2003) 674-680.

Cremer et al., "Optimization of (Ti,Al)N Hard Coat. by a combinatorial Appr." Int. J. Inorganic Mat. 3 (2001) 1181-1184.

Suzuki et al., "Microstructure of Grain Boundaries of (Ti,Al)N Films," Surface and Coatings Tech. 107 (1998) 41-47.

Endrino et at., "Hard AlTiN, AlCrN PVD Coatings for Machining of Austenitic Stainless Steel," Surface and Coatings Tech. 200 (1986) 6840-6845.

Munz, "Titanium Aluminum Nitride Films: A New Alternative to TiN Coatings," J. Vacuum Sci. Tech. A 4(6) (1986) 2717-2725.

Zhou et al., "Phase Transition and Properties of Ti-Al-N Thin Films Prepared by R. F.-Plasma Assisted Magnetron Sputtering," Thin Solid Films 339 (1999) 203-208.

Tanaka et al., "Properties of (Ti1-xAlx)N coatings for Cutting Tools Prepared by the Cathodic Arc Ion Plating Method," J. Vacuum Sci. Tech. A 10(4) (1992) 1749-1756.

Horling et al., "Thermal Stability of Arc Evaporated high Aluminum-Content Ti1-xAlxN Thin Films," J. Vacuum Sci. Tech. A 20(5) (2002) 1815-1823.

Ikeda et al., "Phase Formation and Characterization of Hard Coatings in the Ti-Al-N System Prepared by the Cathodic Arc Ion Plating Method," Thin Solid Films 195 (1991) 99-110.

Kimura et al., "Metastable (Ti1-xAlx)N Films with Different Al Content," J. Mat. Sci. Letters 19 (2000) 601-602.

Cremer et al., "Exp. Determination of Metastable (Ti, Al)N Phase Diagram up to 700C," Val. Addition Metallurgy, Cho & Sohn, Editors, the Min. Metals, & Mat. Soc (1998) 249-258.

* cited by examiner

ALUMINUM TITANIUM NITRIDE COATING AND METHOD OF MAKING SAME

FIELD OF THE INVENTION

The invention relates to aluminum titanium nitride coatings for cutting tools and methods of making the coatings. More specifically, the invention relates to aluminum titanium nitride coatings having a two phase structure of B1 cubic phase and hexagonal phase and compositions of $(Al_xTi_{1-x})N$, where x is in the range of about 0.53 to about 0.58 moles.

BACKGROUND OF THE INVENTION

It is well-known to use hard coatings comprising aluminum titanium nitride to improve the performance of cutting tools. Development of such coatings began in the 1980's and continues today. Some of the developments are taught in the following patents and published patent applications: U.S. Pat. Nos. 7,431,988 B2; 7,188,463 B2; 7,169,485 B2; 7,094,479 B2; 7,018,726 B2; 6,924,454 B2; 6,866,921 B2; 6,844,069 B2; 6,838,151 B2; 6,811,581 B2; 6,737,178 B2; 6,688,817 B2; 6,669,747 B2; 6,599,062 B1; 6,558,749 B2; 6,565,957 B2; 6,395,379 B1; 6,333,099 B1; 6,274,249 B1; 6,250,855 B1; 6,110,571; 6,071,560; 6,033,734; 5,712,030; 5,296,016; European patent nos. EP 1 762 637 B1; EP 1 674 597 B1; EP 1 260 611 B1; EP 1 150 792 B1; EP 1 122 226 B1; EP 1 021 584 B1; EP 1 099 003 B1; EP1 087 026 B1; EP 1 038 989 B1; EP 1 017 870 B1; EP 0 925 386 B1; EP 0 801 144 B1; EP 0 798 399 B1; EP 0 709 353 B1; EP 0 558 061 B1; EP 0 492 059 B1;U.S. published patent application nos. US 2009/0098372 A1; US 2009/0075114 A1; US 2008/0299383 A1; US 2008/02896608 A1; US 2007/0148496 A1; US 2007/0059558 A1; US 2006/0257562 A1; US 2006/0219325 A1; US 2006/0154051 A1; published European patent application nos. EP 2 017 366 A1; EP 2 008 743 A1; EP 2 000 236 A1; EP 1 801 260 A1; EP 1 683 875 A2; EP 1 616 978 A1; EP 1 616 974 A1; EP 1 470 879 A8; and published PCT patent applications WO 2009/031958 A1, and WO 2008/037556 A2. Additionally, the development of such coatings have been the topic of many technical papers, e.g., S. PalDey et al. "Single Layer and Multilayer Wear Resistant Coatings of (Ti,Al)N: A Review," Materials Science and Engineering A342 (2003) 58-79; J. Musil et al. "Superhard Nanocomposite $Ti_{1-x}Al_xN$ Films Prepared by Magnetron Sputtering," Thin Solid Films 365 (2000) 104-109; A. Honing et al. "Mechanical Properties and Machining Performance of $Ti_{1-x}Al_xN$-Coated Cutting Tools," Surface & Coatings Technology 191 (2005) 384-392; G. Håkansson et al. "Microstructure and Physical Properties of Polycrystalline Metastable $Ti_{0.5}Al_{0.5}N$ Alloys Grown by D.C. Magnetron Sputter Deposition," Thin Solid Films 191 (1987) 55-65; C.-T. Huang et al. "Deposition of (Ti,Al)N films on A2 Tool Steel by Reactive R.F. Magnetron Sputtering," Surface and Coatings Technology 71 (1995) 259-266; M. Arndt et al. "Performance of New AlTiN Coatings in Dry and High Speed Cutting," Surface Coatings Technology 163-164 (2003) 674-680; R. Cremer et al. "Optimization of (Ti, Al)N Hard Coatings by a Combinatorial Approach," International Journal of Inorganic Materials 3 (2001) 1181-1184; T. Suzuki et al. "Microstructures and Grain Boundaries of (Ti, Al)N Films," Surface Coatings Technology 107 (1998) 41-47; J. L. Endrino et al. "Hard AlTiN, AlCrN PVD Coatings for Machining of Austenitic Stainless Steel," Surface Coatings Technology 200 (2006) 6840-6845; W.-D. Münz "Titanium Aluminum Nitride Films: A New Alternative to TiN Coatings," J. Vacuum Science Technology A 4(6) (1986) 2717-2725; M. Zhou et al. "Phase Transition and Properties of Ti—Al—N Thin Films Prepared by R.F.-Plasma Assisted Magnetron Sputtering," Thin Solid Films 339 (1999) 203-208; Y. Tanaka et al. "Properties of $(Ti_{1-x}Al_x)N$ Coatings for Cutting Tools Prepared by the Cathodic Arc Ion Plating Method," J. Vacuum Science Technology A 10(4) (1992) 1749-1756; A. Hörling et al. "Thermal Stability of Arch Evaporated High Aluminum-Content $Ti_{1-x}Al_xN$ Thin Films," J. Vacuum Science Technology A 20(5) (2002) 1815-1823; T. Ikeda et al. "Phase Formation and Characterization of Hard Coatings in the Ti—Al—N System Prepared by the Cathodic Arc Ion Plating Method," Thin Solid Films 195 (1991) 99-110; and A. Kimura et al. "Metastable $(Ti_{1-x}Al_x)N$ Films with Different Al Content," J. of Material Science Letters 19 (2000) 601-602.

Despite the crowdedness of this art, the need for improved machining properties continues to drive development efforts. Unfortunately, the teachings of the prior art are sometimes confusing and contradictory. For instance, although it appears to be well established that at low aluminum contents, i.e., at low x values in the formula $(Al_xTi_{1-x})N$, aluminum titanium nitride coatings have the B1 cubic sodium chloride-type crystal structure of titanium nitride and at very high aluminum levels, i.e., high x values, the coating takes on the B4 hexagonal zinc sulfide (Wurtzite)-type crystal structure of aluminum nitride, and that somewhere in between there exists a composition range in which the coating has a two phase structure consisting of a mixture of the cubic and the hexagonal crystal structures, the beginning and end points and the size of the two-phase composition range are in dispute. Some references, e.g., the J. Musil et al. paper identified above, teach the two-phase region occurs in the composition range where $0.52 \leq x \leq 0.59$. Others, e.g., the A. Kimura et al. paper identified above, teach that the composition at which x=0.6 the coating consists of all cubic phase and of all hexagonal phase at x=0.7. Still others, e.g., the T. Ikeda et al. reference identified above, teach that for compositions where x<0.7, the coating consists of all cubic phase whereas at the composition where x=0.7 the coating has a two phase structure and at the composition where x=0.85 the coating consists of all hexagonal phase. Another discrepancy is on the desirability of using aluminum titanium nitride coatings in the two-phase region. One view, as taught by the A. Hörling et al. paper identified above and illustrated in FIGS. 1 and 2, is that such two-phase coatings should be avoided because the two-phase region marks the start of a dramatic drop in the coating hardness and cutting tool life that continues on into the single hexagonal phase region. A contrasting view, as taught by the J. Musil et al. paper identified above, is that the two-phase coatings have very high hardnesses.

It is likely that such discrepancies as these are due to the sensitivity of the properties of aluminum titanium nitride coatings to the exact conditions and parameters used for depositing the coatings as well the conditions and techniques used for measuring the properties. A consequence of the great number of possible conditions and parameter combinations is that it is very difficult to predict what the coating properties will be for a particular aluminum titanium nitride coating composition.

SUMMARY OF THE INVENTION

The present invention provides improved hard coatings comprising aluminum titanium nitride which are usable on cutting tools. The inventors have discovered that such coatings provide surprisingly good machining properties for cemented tungsten carbide cutting tools used for end milling.

In one aspect of the present invention, there is provided a hard coating comprising at least one aluminum titanium nitride layer having between about 0 and 15 weight percent hexagonal phase and a composition of $(Al_xTi_{1-x})N$, where x is in the range of about 0.53 to about 0.58 moles. Preferably the aluminum titanium nitride layer has an average grain size in the range of about 10 to about 40 nanometers. Also preferably, the aluminum titanium nitride layer has a cubic phase with a crystallographic texture characterized by an X-ray diffraction (200) to (111) peak intensity ratio in the range of about 4.5 to about 10. The overall thickness of the hard coating is preferably in the range of about 2 to about 8 microns. Preferably, the hard coatings comprise more than one such aluminum titanium nitride layers.

In another aspect of the present invention, there is provided a coated substrate having the hard coating described in the previous paragraph. Preferably, the substrate is cemented tungsten carbide. Also preferably, the substrate is a cutting tool, and more preferably the substrate is an end mill, a milling tool, a turning tool, or a drilling tool.

In another aspect of the present invention, there is provided a method for making such coated substrates. Preferred embodiments of such methods include cathode arc depositing a coating having multiple aluminum titanium nitride layers wherein the biasing voltage is increased during the deposition of each successive layer.

BRIEF DESCRIPTION OF THE DRAWINGS

The criticality of the features and merits of the present invention will be better understood by reference to the attached drawings. It is to be understood, however, that the drawings are designed for the purpose of illustration only and not as a definition of the limits of the present invention.

DESCRIPTION OF PREFERRED EMBODIMENTS

In this section, some preferred embodiments of the present invention are described in detail sufficient for one skilled in the art to practice the present invention. It is to be understood, however, that the fact that a limited number of preferred embodiments are described herein does not in any way limit the scope of the present invention as set forth in the appended claims.

Preferred embodiments of the present invention include hard coatings which comprise at least one aluminum titanium nitride layer having between about 0 and about 15 weight percent hexagonal phase and a composition of $(Al_xTi_{1-x})N$, where x is in the range of about 0.53 to about 0.58 moles. Such coatings may consist of a single layer or they may comprise a plurality of such aluminum titanium nitride layers, either alone or in combination with layers of other coating materials. These other coating materials may comprise aluminum titanium nitride of compositions of $(Al_xTi_{1-x})N$, where x is not in the range of about 0.53 to about 0.58 moles, such as TiN and $(Al_xTi_{1-x})N$ with aluminum less than 0.53 moles.

Figure 1:
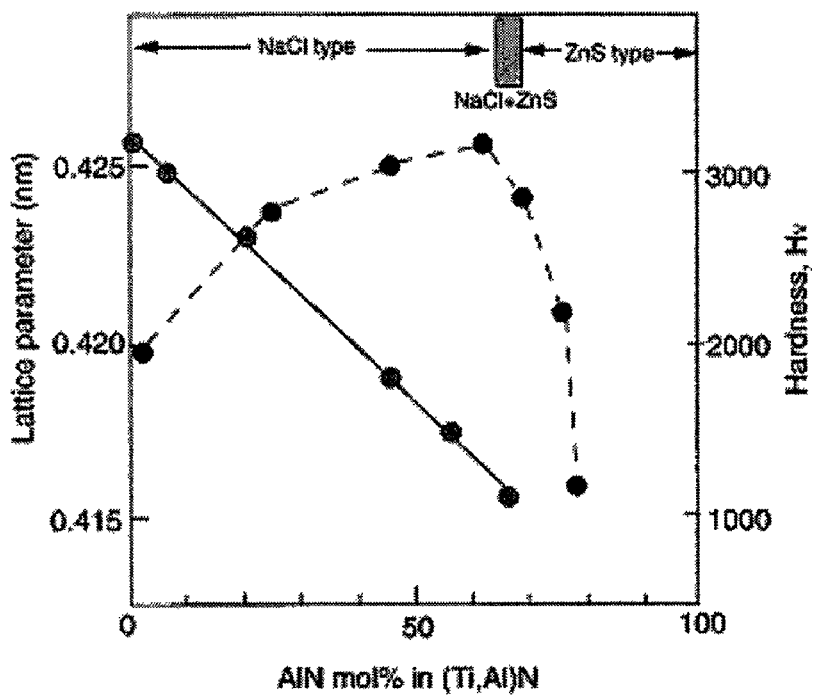
FIG. 1 is a prior art graph of the variation of aluminum titanium nitride coating hardness with aluminum content.
Figure 2:
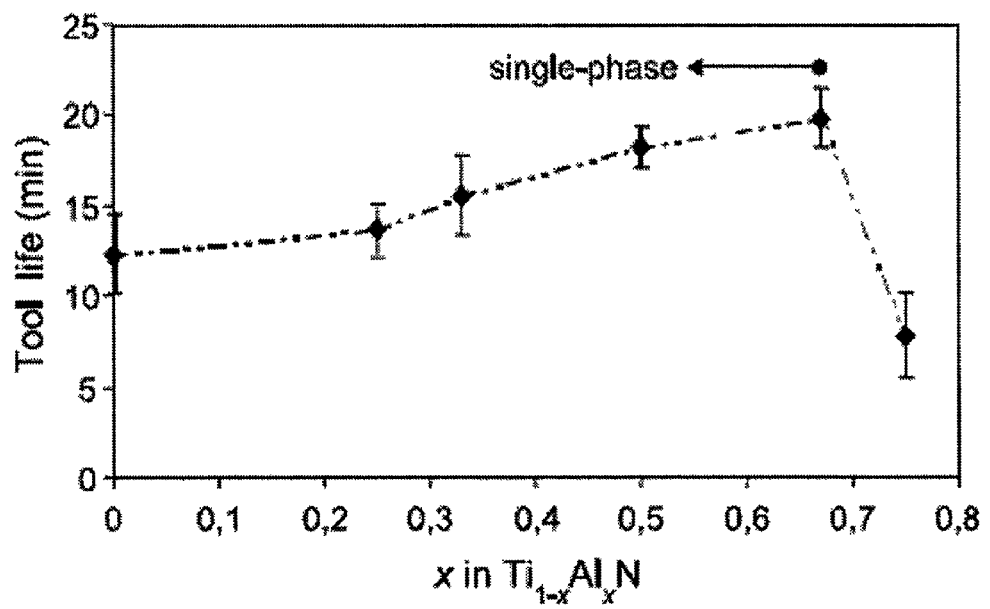
FIG. 2 is a prior art graph of the variation of the tool life of aluminum titanium nitride coated tools with aluminum content.
Figure 3:
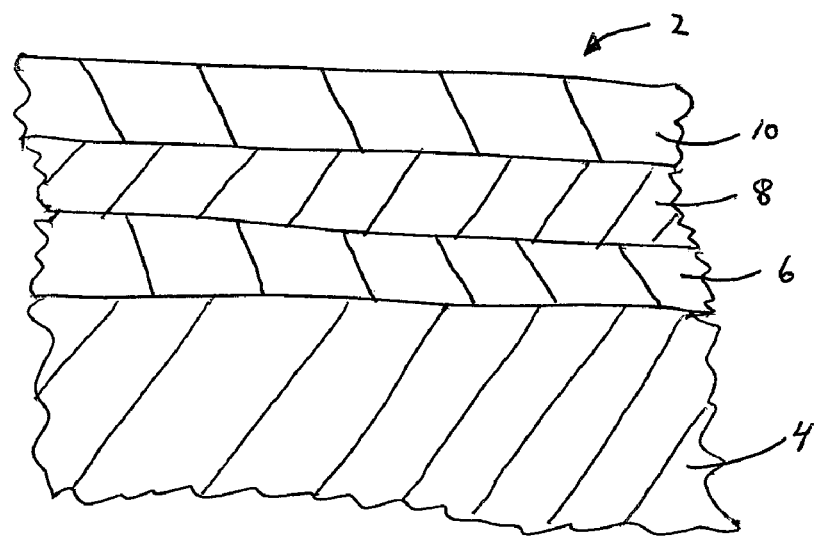
FIG. 3 is a schematic cross-sectional view of a multilayer aluminum titanium nitride coating according to an embodiment of the present invention.

Referring now to FIG. 3, there is shown a hard coating 2 according to an embodiment of the present invention. The coating 2 coats a substrate 4. The coating 2 comprises a first aluminum titanium nitride layer 6, a second aluminum titanium nitride layer 8, and a third aluminum titanium nitride layer 10. Each of the first, second, and third aluminum titanium nitride layers contains a cubic phase and between about 0 and about 15 weight percent of a hexagonal phase and has a composition of $(Al_xTi_{1-x})N$, where x is in the range of about 0.53 to about 0.58 moles.

Figure 4:
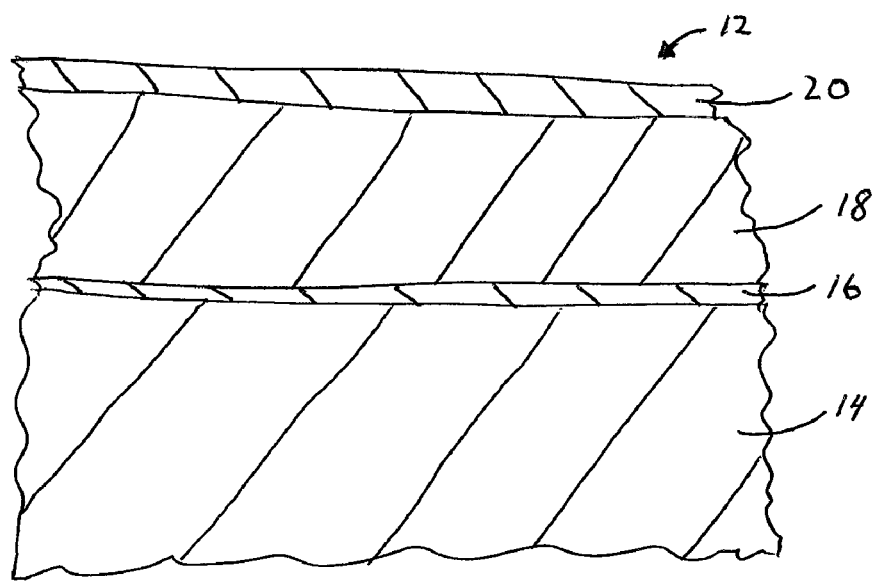
FIG. 4 is a schematic cross-sectional view of a multilayer coating according to another embodiment of the present invention.

Referring now to FIG. 4, there is shown a hard coating 12 on a substrate 14 according to another embodiment of the present invention. The coating 12 has a TiN bonding layer 16, an aluminum titanium nitride layer 18, and top TiN layer 20 which is less than 1.5 µm thick.

The amount of hexagonal phase is to be determined by x-ray diffraction using the Reitveld method, which is a full pattern fit method. In the Reitveld method, the measured specimen profile is compared with a calculated profile and the variations between the two profiles are minimized by adjusting various parameters. The x-ray diffraction pattern of a coating is collected with a parallel beam optics x-ray diffraction system employing a grazing incidence technique using a 1 degree grazing angle for collection. The x-ray diffraction system uses a copper x-ray tube (operated at 45 KV and 40 MA), an x-ray mirror with a 1/16 degree anti-scatter slit, a 0.04 radian soller slit, and receiving optics which include a flat graphite monochromator, a parallel plate collimator, and a sealed proportional counter. The coating specimen height is set using x-ray beam splitting and the counting times and scan rate are optimized for Reitveld method analysis. During the analysis, a background profile is fitted and peak search is performed on the collected specimen data to identify all peak positions and peak intensities, which are used to identify the phase composition of the specimen using conventional crystal phase databases.

The coatings of the present invention may be deposited upon any desired substrate. However, it is preferred that the substrate be a cutting tool and more preferably that it be an end mill tool, a milling tool, a turning tool, or a drilling tool. Any substrate material that is compatible with the cathodic arc deposition method may be used with embodiments of the present invention, but preferably the substrates are cemented tungsten carbide.

The overall thickness of the coatings according to the present invention is to be selected with respect to the application to which the coated substrate is to be used, as well as the nature of the substrate and the number of layers making up the coating. Preferably, the overall thickness of the coatings is in the range of about 2 to about 8 microns.

In some embodiments of the present invention, the coatings are deposited by the cathode arc process, although other deposition processes may be used, e.g. magnetron sputtering, filtered cathodic arc evaporation. Preferably, the substrate is at a temperature of between 400° C. and 600° C. during the deposition of each of the aluminum titanium nitride layers having about 0 and about 15 weight percent hexagonal phase and a composition of $(Al_xTi_{1-x})N$, where x is in the range of about 0.53 to about 0.58 moles. It is also preferred that the substrate biasing voltage for these layers be in the range of about −40 to about −100V.

EXAMPLES

Example 1

A five micron thick hard coating according the present invention comprising three aluminum titanium nitride layers was deposited on a cemented tungsten carbide substrate using a cathode arc deposition unit having six powder metallurgy prepared targets of 60 atomic percent aluminum and 40 atomic percent titanium composition. The substrate was mounted on a double rotation carousel. For each layer, the source power was 3.75 kilowatts and the atmosphere was a mixture of argon flowing at 200 sccm and nitrogen flowing at 1170 sccm with a total pressure of $5 \times 10^{-2}$ millibar. The first layer was deposited in 16.8 minutes using a −50 V biasing voltage. The second layer was deposited in 109 minutes using a −60 V biasing voltage; and the third layer was deposited in 41.9 minutes using a −80 V biasing voltage. The overall composition of the coating was measured using a 20 KV JOEL (JSM 6400) scanning electron microscope (SEM) equipped with Oxford INCA energy dispersive spectrometer (EDS) and was determined to be $Al_{0.56}Ti_{0.44}N$. Thin film XRD was used to measure phase constitution. It is conducted on Panalytical X'pert Pro MRD instrument equipped with Eulerian cradle using a grazing incident angle of one degree. It was revealed the coating to be two phase consisting of cubic phase and 7.9 wt % hexagonal phase. The coating was determined by X-ray diffraction to have an average grain size of 15.3 nanometers. Coating texture was measured by X-ray diffraction with Bragg-Brentano ($\theta\sim2\theta$) configuration. It is conducted on Panalytical X' pert Pro MPD instrument (PANalytical B.V.) using Cu K$\alpha$ radiation (45 KV, 40 mA). The intensity ratio of the (200) diffraction peak to that of the (111) peak was determined to be 7.3. Coating hardness was measured using Fischerscope HM2000 (Fischer technology Inc.) according to ISO standard 14577 using a Vickers indenter. Indentation depth was set at 0.25 µm. The average of fifteen measurements is reported. The measured hardness and Young's modulus of the coating were 30.1 GPa and 437 respectively.

Example 2

Coatings having the compositions given in Table 1 were deposited on the cutting tool substrates identified in that table by the cathode arc deposition process similar to that described in Example 1. The composition, microstructure, grain size, hardness, and Young's modulus of each coating, as measured by the methods identified in Example 1, are also given in Table 1. The coatings of Invention 1 and 2 are according to embodiments of the present invention. The coating of Comparative 1 is a comparison coating of aluminum titanium nitride having slightly lower aluminum content and a microstructure consisting solely of cubic phase. The coatings of Comparative 2 and 3 are comparative samples of commercial grade aluminum titanium nitride coatings having aluminum contents higher than those of the aluminum titanium nitride coatings of the present invention and microstructures consisting of cubic and hexagonal phases.

TABLE 1

| Sample ID | x Value for $(Al_xTi_{1-x})N$ | Phases | Hexagonal Phase (weight %) | Grain Size (nm) | Hardness (GPa) | Young's Modulus (GPa) |
|---|---|---|---|---|---|---|
| Invention 1 | 55.9 | cubic + hexagonal | 7.9 | 15.3 | 30.1 | 437 |
| Invention 2 | 53.2 | cubic + hexagonal | 1.2 | 17.8 | 31.3 | 449 |
| Comparative 1 | 48.7 | cubic | 0 | beyond equipment detection limit of 200 nm | 30.3 | 507 |
| Comparative 2 | 61.2 | cubic + hexagonal | 12.6 | 10.7 | 28.3 | 428 |
| Comparative 3 | 63.1 | cubic + hexagonal | 31 | 18.9 | 25.2 | 359 |

Example 3

An end milling test was conducted to evaluate an embodiment of a coating of the present invention. Coating thickness was 3 microns. The substrates were WC-10 wt % Co grade cemented tungsten carbide in the form of 1 cm diameter end mill cutting tools. The substrates were mounted on triple rotation carousel. The cutting stock material was 316 stainless steel. The testing conditions and results of the test are given in Table 2 and the compositions of the coatings tested are given in Table 1. The results show that the coating of the present invention performed surprisingly better than the comparative samples.

TABLE 2

| Sample ID | x Value for $(Al_xTi_{1-x})N$ | Speed (Surface m/minute) | Feed (cm/rev.) | Depth of cut (cm) | Coolant | Tool Life (meters) |
|---|---|---|---|---|---|---|
| Invention 1 | 55.9 | 80.5 | 0.01524 | 0.0254 | Flood | 91.0 |
| Comparative 1 | 53.4 | 80.5 | 0.01524 | 0.0254 | Flood | 29.4 |
| Comparative 2 | 61.2 | 80.5 | 0.01524 | 0.0254 | Flood | 67.9 |
| Comparative 3 | 63.1 | 80.5 | 0.01524 | 0.0254 | Flood | 44.8 |

While only a few embodiments of the present invention have been shown and described, it will be obvious to those skilled in the art that many changes and modifications may be made thereunto without departing from the spirit and scope of the present invention as described in the following claims. All patent applications and patents, both foreign and domestic, and all other publications referenced herein are incorporated herein in their entireties to the full extent permitted by law.

What is claimed is:

1. A coating for a cutting tool substrate comprising at least one aluminum titanium nitride layer, the aluminum titanium nitride layer having a composition of $(Al_xTi_{1-x})N$ wherein x is in the range of about 0.53 and about 0.58 moles and a microstructure comprising between about 1 and about 15 weight percent hexagonal phase.

2. The coating of claim 1, wherein the aluminum titanium nitride layer has an average grain size in the range of about 10 to about 40 nanometers.

3. The coating of claim 1, wherein the aluminum titanium nitride layer has a cubic phase having a texture characterized by an X-ray diffraction (200) to (111) peak intensity ratio in the range of about 4.5 to about 10.

4. The coating of claim 1, wherein the coating thickness is in the range of about 2 to about 8 microns.

5. A coated substrate comprising a coating having at least one aluminum titanium nitride layer, the aluminum titanium nitride layer having a composition of $(Al_xTi_{1-x})N$ wherein x is in the range of about 0.53 and about 0.58 moles and a microstructure comprising between about 1 and 15 weight percent hexagonal phase.

6. The coated substrate of claim 5, wherein the aluminum titanium nitride layer has an average grain size in the range of about 10 to about 40 nanometers.

7. The coated substrate of claim 5, wherein the aluminum titanium nitride layer has a cubic phase having a texture characterized by an X-ray diffraction (200) to (111) peak intensity ratio in the range of about 4.5 to about 10.

8. The coated substrate of claim 5, wherein the substrate comprises cemented tungsten carbide.

9. The coated substrate of claim 5, wherein the substrate comprises a cutting tool.

10. The coated substrate of claim 9, wherein the cutting tool is selected from the group consisting of an end mill tool, a milling tool, a turning tool, and a drilling tool.

* * * * *